(12) United States Patent
Lin et al.

(10) Patent No.: US 8,466,051 B2
(45) Date of Patent: Jun. 18, 2013

(54) METHOD FOR FABRICATING SCHOTTKY DEVICE

(75) Inventors: Yung-Fa Lin, Hsinchu (TW); Shou-Yi Hsu, Hsinchu County (TW); Meng-Wei Wu, Hsinchu (TW); Main-Gwo Chen, Hsinchu County (TW); Chia-Hao Chang, Hsinchu (TW); Chia-Wei Chen, Taipei (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/338,256

(22) Filed: Dec. 28, 2011

(65) Prior Publication Data
US 2013/0130485 A1    May 23, 2013

(30) Foreign Application Priority Data
Nov. 18, 2011   (TW) .............................. 100142440 A (51) Int. Cl.
*H01L 21/338* (2006.01)
*H01L 29/812* (2006.01)

(52) U.S. Cl.
USPC ............ 438/572; 438/167; 438/581; 438/583

(58) Field of Classification Search
USPC ................... 438/92, 167, 169, 570, 572, 580, 438/581, 582, 583
See application file for complete search history.

(56) References Cited

U.S. PATENT DOCUMENTS

| 5,643,821 | A * | 7/1997 | Beasom ...................... 438/355 |
| 7,687,376 | B2 * | 3/2010 | Choi et al. .................... 438/478 |
| 2010/0258899 | A1 * | 10/2010 | Huang et al. .................. 257/484 |

* cited by examiner

*Primary Examiner* — Zandra Smith
*Assistant Examiner* — Pamela E Perkins
(74) *Attorney, Agent, or Firm* — Winston Hsu; Scott Margo (57) ABSTRACT

A method for fabricating a Schottky device includes the following sequences. First, a substrate with a first conductivity type is provided and an epitaxial layer with the first conductivity type is grown on the substrate. Then, a patterned dielectric layer is formed on the epitaxial layer, and a metal silicide layer is formed on a surface of the epitaxial layer. A dopant source layer with a second conductivity type is formed on the metal silicide layer, followed by applying a thermal drive-in process to diffuse the dopants inside the dopant source layer into the epitaxial layer. Finally, a conductive layer is formed on the metal silicide layer.

7 Claims, 8 Drawing Sheets

METHOD FOR FABRICATING SCHOTTKY DEVICE

BACKGROUND OF THE INVENTION

1. Field of the Invention

The present invention generally relates to the field of Schottky devices. More particularly, the invention relates to a fabricating method of a Schottky device that lowers current leakage.

2. Description of the Prior Art

It is well known that Schottky devices are suitable to serve as rectifiers with high-frequency operating ranges. Unlike a conventional PN-junction device, the Schottky device has a metal/semiconductor junction wherein the metal part of the junction comprises gold, silver, or platinum. Therefore, the transmitted currents in the metal/semiconductor junction are mainly carried by the majority carriers. For this reason, high-frequency signals produced by Schottky devices can be turned-off quicker than in conventional PN-junction devices.

A structure of a conventional Schottky device usually comprises the following components: at least an N-type substrate, an N-type epitaxial layer, a ring-shaped field oxide layer, a silicide layer, a conductive source layer, and a conductive drain layer. The above-mentioned N-type epitaxial layer is grown on the N-type substrate by an epitaxial process, and the ring-shaped field oxide layer, like silicon dioxide for example, is formed on a surface of the N-type epitaxial layer to define an active region. The silicide layer is then formed in the active region defined by the ring-shaped field oxide layer. Two conductive layers are formed on the silicide layer and on the bottom of the N-type substrate, wherein the drain conductive layer and the N-type epitaxial layer comprise a Schottky contact. In addition, at least a P-type guard ring may be formed in the N-type epitaxial layer near the regions covered by the ring-shaped field oxide layer so that adjacent devices may be electrically isolated and current leakage resulting from electric field crowding in a terminal structure may be prevented.

The prior art described above has however many drawbacks that need to be overcome. For example, because of technical limitations of epitaxial growth and self-aligned silicide (salicide) processes, many defects, such as lattice defects, may remain in the N-type epitaxial layer near its surface. Those defects may become parts of the Schottky contact and may reduce voltage sustaining ability of the Schottky. A device with defects near a metal/semiconductor junction is prone to produce reverse leaking current, contrary to one with no defects.

In light of the above, there is still a need for a method for fabricating an improved Schottky device that is able to overcome the shortcomings and deficiencies of the prior art.

SUMMARY OF THE INVENTION

It is one objective of the invention to provide a method for fabricating a Schottky device that prevents current leakage resulting from the defects in the metal/semiconductor junction.

To this end, according to one embodiment of the invention, a fabricating method of a Schottky device is provided, including the following processes. A substrate with a first conductivity type is provided. An epitaxial layer on the substrate is formed, wherein the epitaxial layer has the first conductivity type. A patterned dielectric layer is formed on the epitaxial layer. A silicide layer is formed on a surface of the epitaxial layer. A dopant source layer is formed on the silicide layer, wherein the dopant source layer has a plurality of dopants of a second conductivity type. A thermal drive-in process is performed to diffuse the dopants from the dopant source layer into the epitaxial layer. Finally, a conductive layer is formed on the silicide layer.

According to another embodiment of the invention, the invention provides a method for fabricating a Schottky device including the following processes. A substrate having a first conductivity type is provided. An epitaxial layer is formed on the substrate, wherein the epitaxial layer has the first conductivity type and at least a lattice defect structure located under a surface of the epitaxial layer. A silicide layer is formed on the surface of the epitaxial layer. A doped region with a second conductivity type is formed in the lattice defect structure, wherein a PN junction is formed between the doped region and the epitaxial layer. Finally, a conductive layer is formed on the silicide layer.

The present invention provides a Schottky device where a PN-junction is at an interface between an epitaxial layer and a lattice defects structure. Since the PN-junction has a relatively high voltage sustaining ability, current leakage can be prevented; hence electric performance and reliability of the Schottky can be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, are incorporated in, and constitute a part of this specification. The drawings illustrate some of the embodiments and, together with the description, serve to explain their principles. In the drawings:

FIGS. 1-8 are schematic, cross-sectional diagrams showing a method for fabricating a Schottky device according to embodiments of the invention, wherein

FIG. 8 is a schematic, cross-sectional diagram showing a Schottky device according to one embodiment of the invention.

It should be noted that all the figures are diagrammatic. Relatively high dimensions and proportions of parts of the drawings have been drawn exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details.

Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 1:
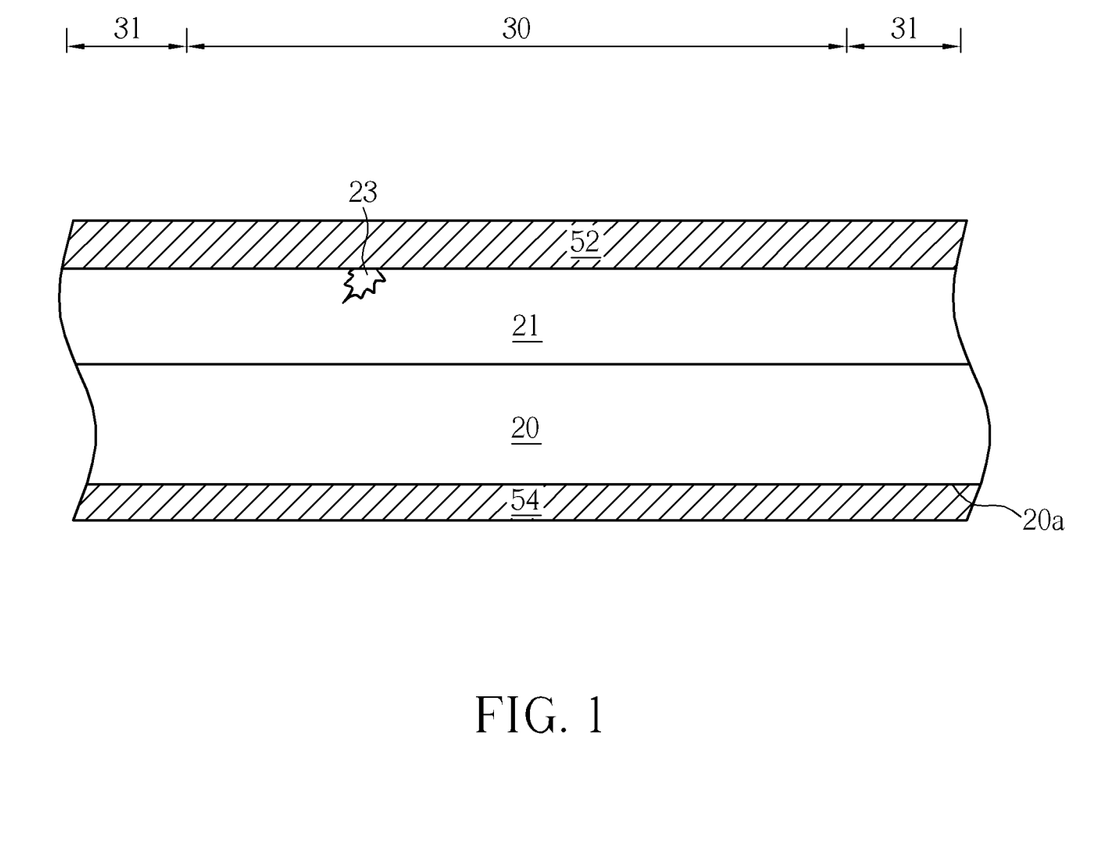

Please refer to FIGS. 1-8. FIGS. 1-8 are schematic, cross-sectional diagrams showing a method for fabricating a Schottky device according to the embodiments of the invention. First, as shown in FIG. 1, a heavily doped substrate 20 with a first conductivity type is provided, like an $N^+$ silicon substrate for example, an active region 30 and a peripheral region 31 are defined in the substrate 20, wherein the active region 30 may comprise a Schottky contact. In addition, a thick oxide layer 54, such as silicon oxide, may be formed on a backside 20a of the substrate 20, and a thickness of which is about 6000 angstrom, but is not limited thereto. Then, a regular epitaxial growth process is carried out to form an epitaxial layer 21 with the first conductivity type on a front surface of the substrate 20, like an $N^-$ silicon epitaxial layer for example. A doping concentration of the epitaxial layer 21 is preferred to be lower than that of the substrate 20. By performing a thermal oxidation process, a field oxide layer 52, like silicon oxide layer for example, is formed above the epitaxial layer 21. The fabricating method for forming the field oxide layer 52 is not restricted to a thermal oxidation process; it may otherwise comprise a high density plasma chemical vapor deposition (HDPVCVD) process, a sub atmosphere CVD (SACVD) process, or a spin on dielectric (SOD) process and so on. Please still refer to FIG. 1; because of technical process limitations in forming epitaxial layers, many lattice defect structures 23, such as seam defects, void defects, and lattice dislocation may exist near a surface of the epitaxial layer 21. The lattice defect structures 23 near a metal/semiconductor junction may reduce voltage sustaining ability of the Schottky, unlike those with no defects. As a result, when the Schottky device is operated, current leakage often occurs.

Figure 2:
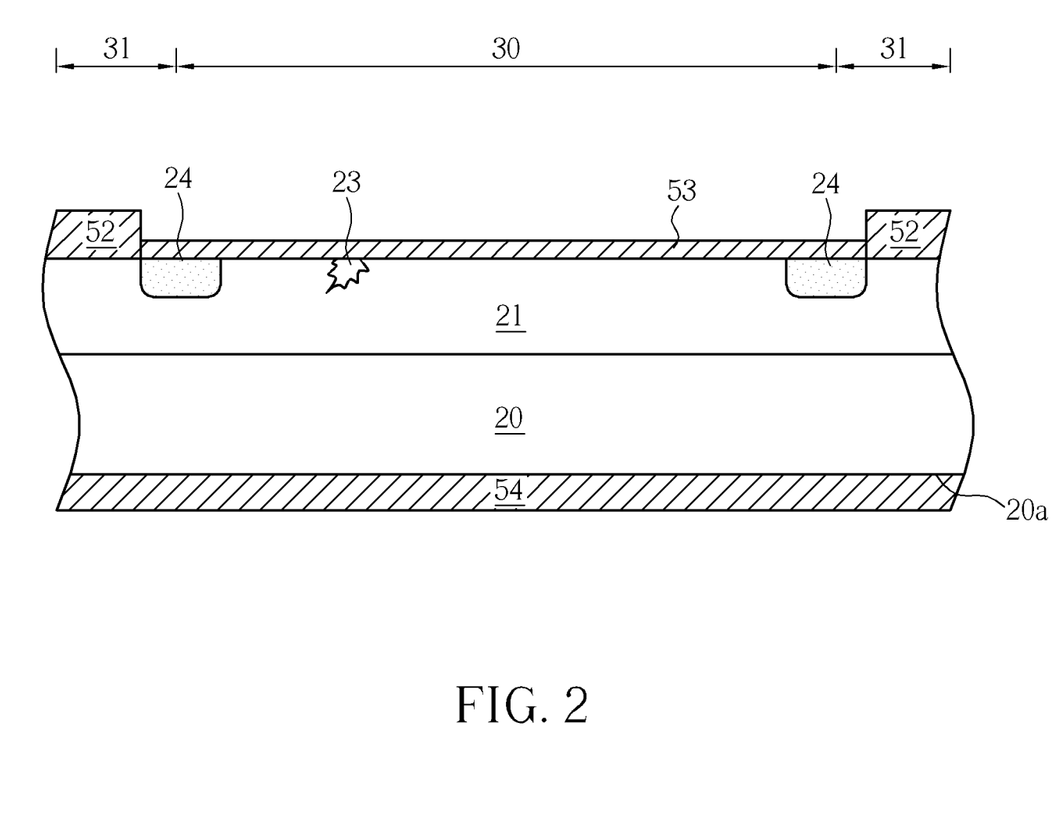
FIG. 2 is a schematic drawing of a step subsequent to FIG. 1.
Figure 3:
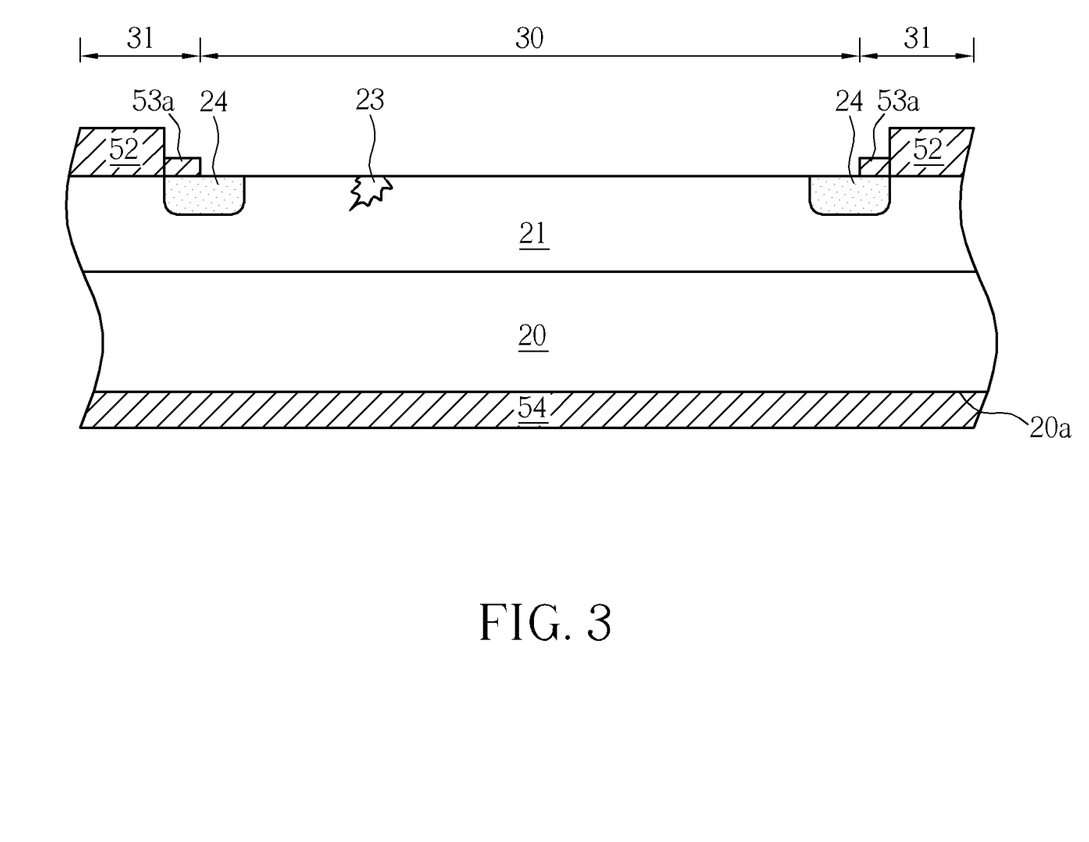
FIG. 3 is a schematic drawing of a step subsequent to FIG. 2.

Please refer to FIG. 2 and FIG. 3. In the subsequent processes, a guard ring structure 24 is defined to prevent a Schottky device from electrical interferences with adjacent devices or components. The process is described as follows: first, parts of the surface of the epitaxial layer 21 are exposed by performing a photolithography and an etching process, but portions of the epitaxial layer 21 in the peripheral region 31 are still covered by the field oxide layer 52; then, by performing a thermal oxidation process, a sacrificial oxide layer 53 is formed on the surface of the epitaxial layer 21, which is exposed from the field oxide layer 52. The purpose of forming the sacrificial oxide layer 53 is to prevent high energy ion impacts on the surface of the epitaxial layer 21 in a following process; a patterned photoresist (not shown) is formed on the epitaxial layer 21 by performing a photolithography process to define a region for receiving a guard ring structure 24; an ion implantation process is then carried out to form the guard ring structure 24 with a second conductivity type, $P^+$ type for example, near the surface of the epitaxial layer 21, and a concentration of which is preferred to be larger than that of the adjacent epitaxial layer 21; finally, the patterned photoresist is removed and a annealing process is carried out to activate the dopants inside the guard ring structure 24. By performing the processes described above, the guard ring structure 24 is defined and embedded in the epitaxial layer 21. As shown in FIG. 3, the sacrificial oxide layer 53 in the active region 30 is removed by using another succession of photolithography and etching processes, so that a patterned sacrificial oxide layer 53a is formed. It is worth noting that parts of the guard ring structure 24 are still covered by the patterned sacrificial oxide layer 53a.

Figure 4:
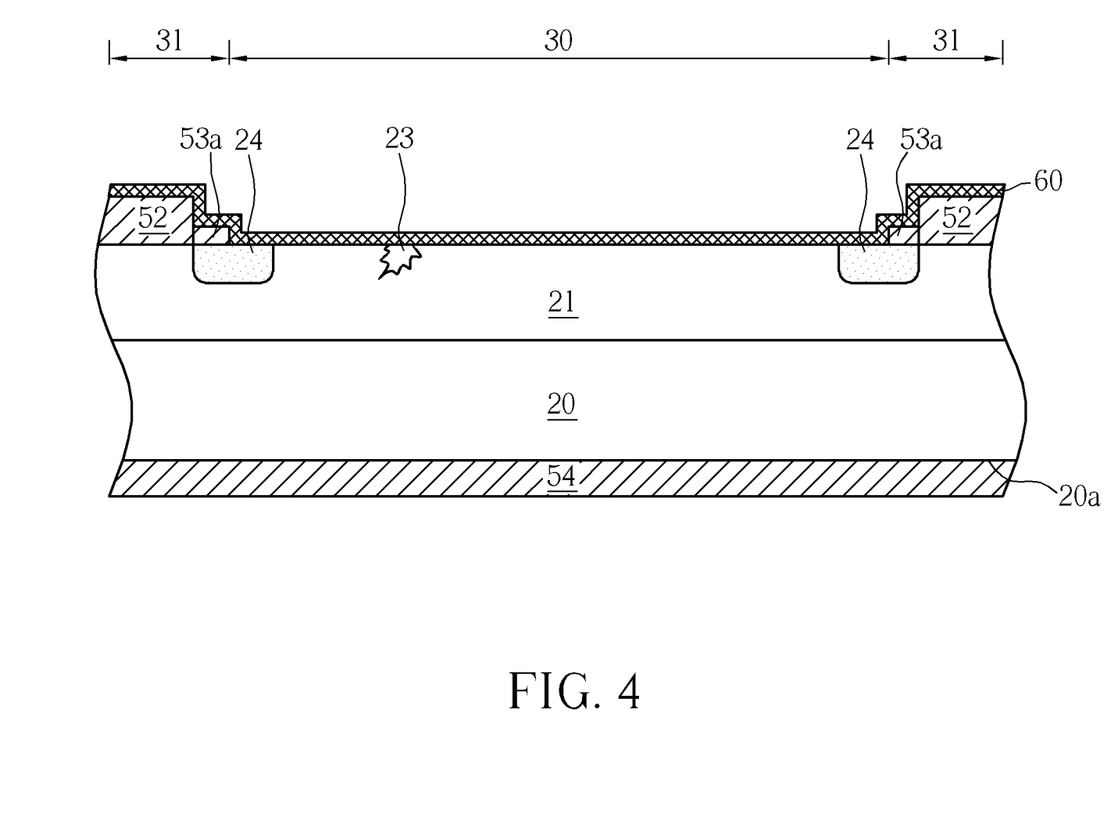
FIG. 4 is a schematic drawing of a step subsequent to FIG. 3.
Figure 5:
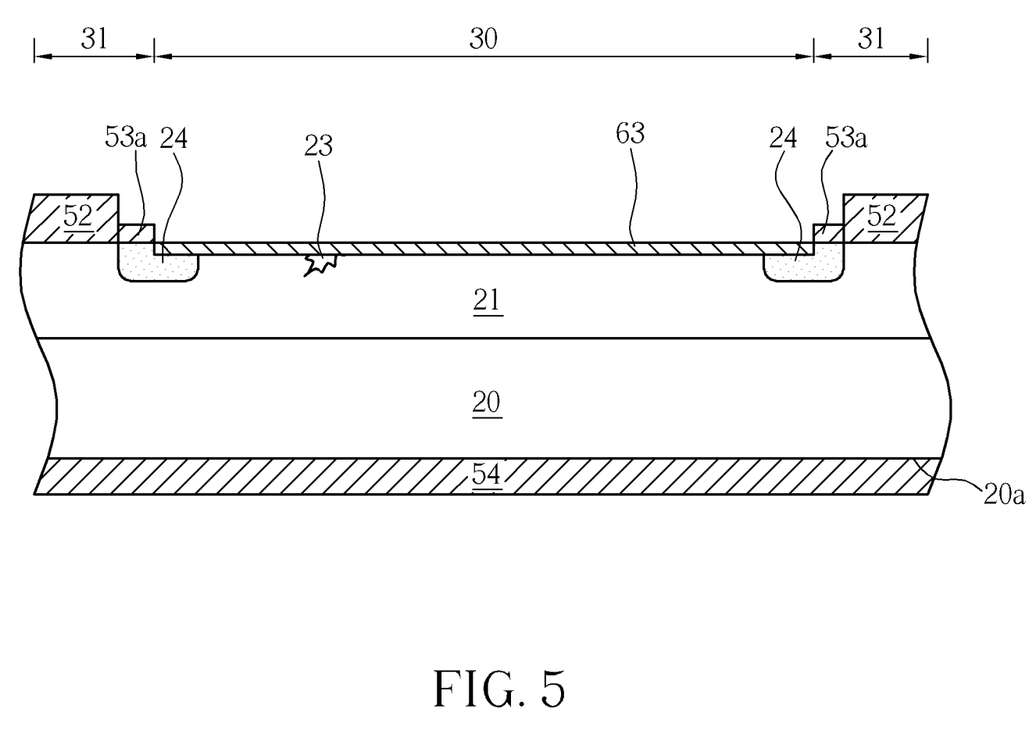
FIG. 5 is a schematic drawing of a step subsequent to FIG. 4.

Please refer to FIG. 4 and FIG. 5. In the subsequent processes, a silicide layer is formed on the surface of the epitaxial layer 21 within the active region 30 to form a Schottky metal contact. As shown in FIG. 4, a layer of metal layer 60 is formed, which works as a metal source layer for forming a silicide 63. In addition, the metal layer 60 includes titanium, nickel, platinum, cobalt, chromium or one of their alloys, with preference for titanium according to this embodiment. Then, as shown in FIG. 5, a rapid thermal process in an inert gas environment, such as nitrogen gas, is performed, allowing the metal atoms inside the metal layer 60 to diffuse into the epitaxial layer 21 and form a silicide 63. The composition of the silicide 63 corresponds to the composition of the metal layer 60. For example, if the composition of the metal layer 60 is nickel, the composition of the silicide 63 is nickel silicide ($Ni_2Si$). According to this embodiment, the metal layer 60 is Ti and the silicide 63 is titanium silicide ($TiSi_2$). In addition, as shown in the figure, parts of the lattice defect structure 23 may be embedded in the silicide 63. Finally, an unreacted metal layer 60 is removed to expose the surface of the epitaxial layer 21.

Figure 6:
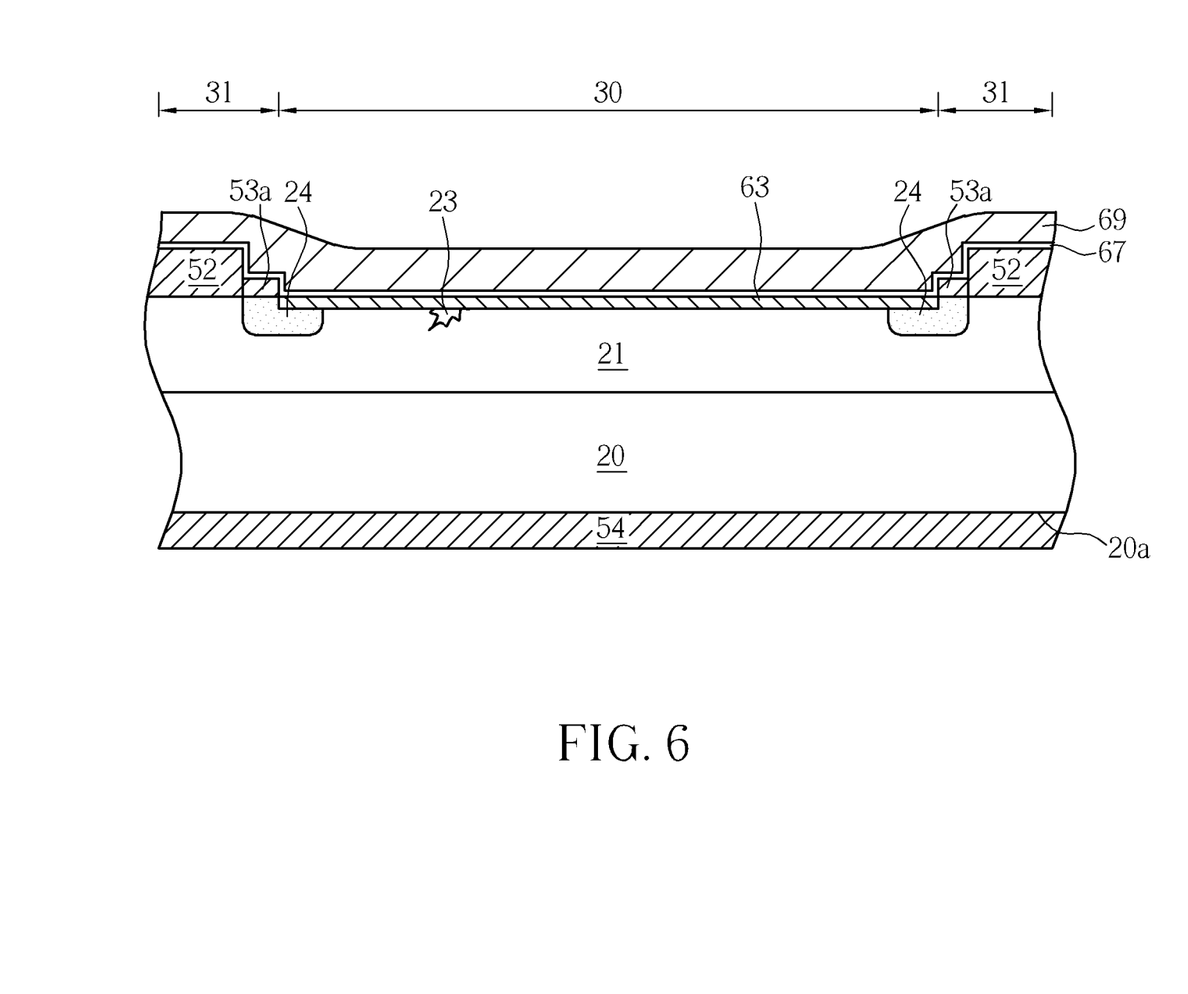
FIG. 6 is a schematic drawing of a step subsequent to FIG. 5.
Figure 7:
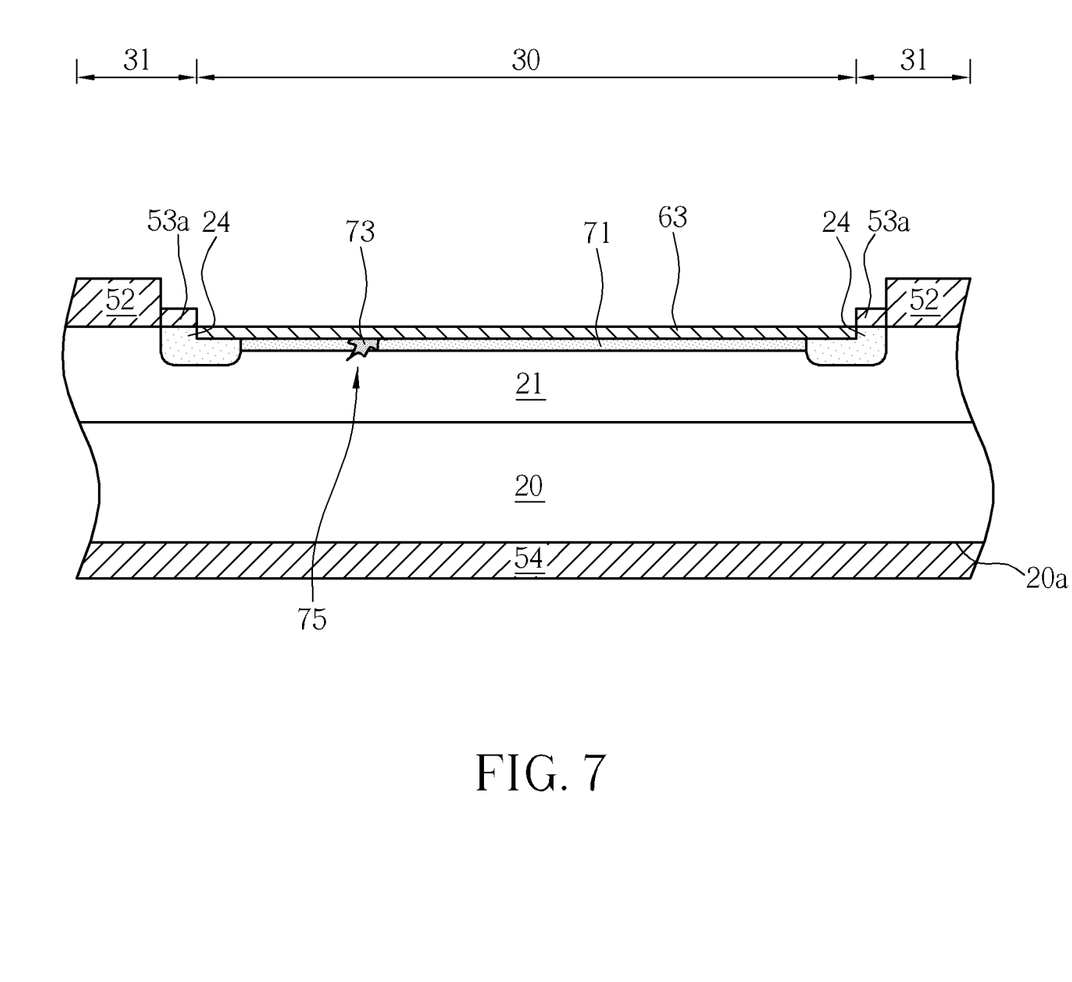
FIG. 7 is a schematic drawing of a step subsequent to FIG. 6.

Based on the previous paragraphs, after forming the silicide 63, there are still some lattice defect structures 23 left inside the epitaxial layer 21. In order to eliminate the electrical effects on a Schottky device caused by the lattice defect structures 23, the present invention provides a thermal diffusion process (or thermal drive-in) to eliminate them. The main technical features are described as follows. As shown in FIG. 6, a dopant source region 69 is formed on the epitaxial layer 21, which comprises a plurality of dopants of a second conductivity type, like boron for example, and a composition of the dopant source region 69 may include epitaxial silicon (or monocrystalline silicon), polycrystalline silicon, amorphous silicon, or borosilicate glass (BSG), but is not limited thereto. As shown in FIG. 7, a thermal drive-in process is then performed to diffuse the dopants from the dopant source region 69 into the epitaxial layer 21. In addition, in order to improve the distribution uniformity of the diffused dopants, a buffer layer 67 may optionally be formed on the interface between the dopant source region 69 and the epitaxial layer 21 to improve the contact properties of the interface. The above-mentioned thermal diffusion process may also include a rapid thermal process (RTP), a spike thermal annealing, a laser thermal annealing (LTA), or a laser spike annealing, (LSA), but not limited thereto. Moreover, according another embodiment of the invention, the thermal drive-in process may be replaced with a vapor phase diffusion process or an ion implantation process, that is to say, the dopant source region 69 is not formed on the epitaxial layer 21 and dopants with the second conductivity type are either diffused into the epitaxial layer 21 with a gas phase or impinged into the epitaxial layer 21 under ionized form.

Still refer to FIG. 7. Through the processes described above, e.g. thermal drive-in, vapor phase diffusion, or ion implantation process, a modulated carrier concentration region 71 is formed and is in contact with a bottom of the silicide 63. In all of the embodiments of the invention, the conductivity type of the modulated carrier concentration region 71 is of the first conductivity type, N-type for example, and a concentration of the main carriers is approximately lower than that of an adjacent epitaxial layer 21 of the first conductivity type; for example, the concentration of the epitaxial layer 21 adjacent to the 71 ranges between 1e12 atoms/cm$^3$ and 1e19 atoms/cm$^3$. Therefore, no PN-junction is formed between the modulated carrier concentration region 71 and the epitaxial layer 21. In addition, an energy barrier between them may increase slightly, which may prevent current leakage. It is worth noting that, since the lattice arrangement of the lattice defect structure 23 is less compact than that of a relative perfect crystalline structure, dopants of the second conductivity type are prone to diffuse into the lattice defect structure 23 at the time of formation the modulated carrier concentration region 71. Hence, a doped region 75 with the second conductivity type is formed inside the epitaxial layer 21, where the concentration ranges approximately from 1e14 atoms/cm$^3$ to 1e19 atoms/cm$^3$. The volume of the doped region 75 may approximately equal or be slightly larger than that of the lattice defect structure 23. For this reason, a PN-junction 75 is formed between the doped region 75 and the epitaxial layer 21 or the modulated carrier concentration region 71. When a Schottky device with the above described structure sustains a reverse voltage, the PN-junction 75 encompassing the lattice defect structure 23 will enlarge the depletion region correspondingly. Since a PN-junction is able to sustain a relatively high reverse voltage, no leakage current can pass through the lattice defect structure 23. It should be noted that, according to another embodiment of the invention, the first conductivity type can be interchanged with the second conductivity type, that is to say, the first conductivity type could be P-type while the second conductivity type is N-type. Even in this case, there the PN-junction 75 between the doped region 75 and the epitaxial layer 21 or the carrier concentration modulated region 71 is still needed.

Figure 8:
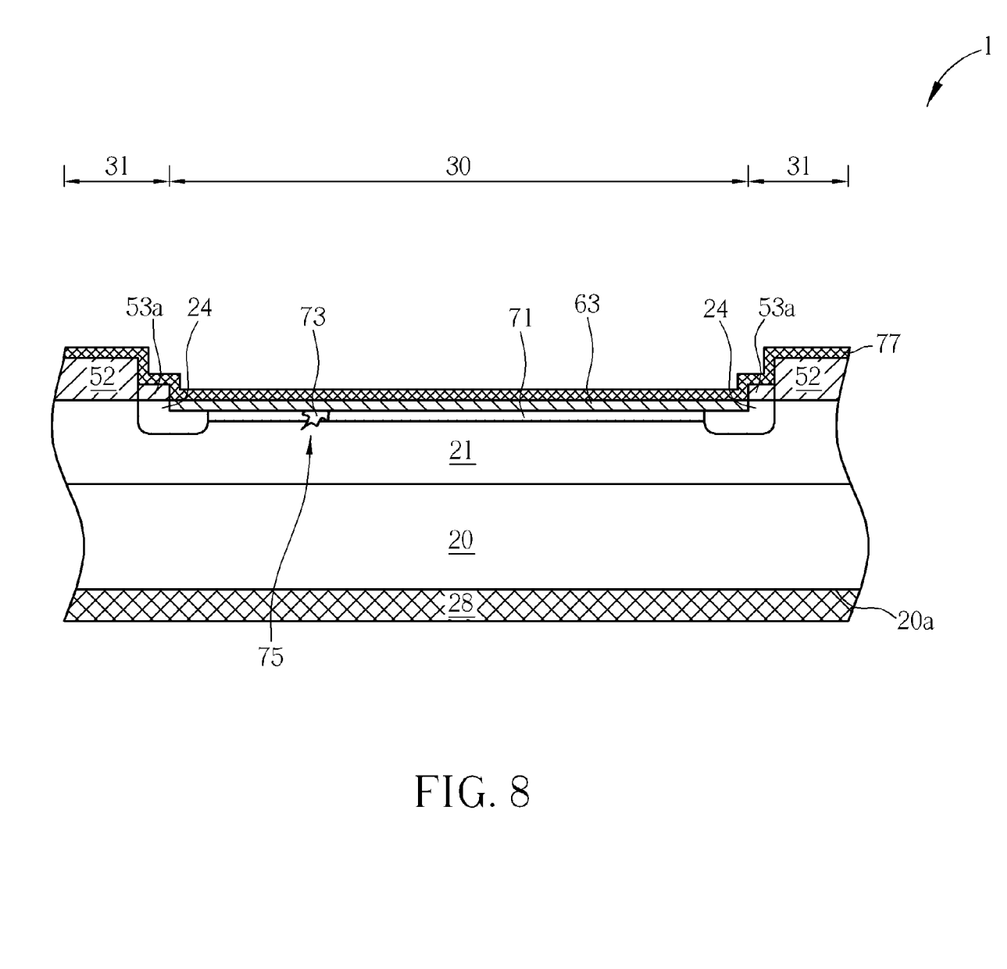

Finally, as shown in FIG. 8, a polishing process, such as CMP, is performed to remove the backside oxide layer 54 of the substrate 20 to expose the backside 20a. Conductive layers 77 and 28 are formed on the silicide 63 and below the backside 20a, respectively, wherein the conductive layer 77 and the epitaxial layer 21 comprise a metal contact, and the conductive layer 28 and substrate 20 comprise an ohmic contact. Additionally, the compositions of the conductive layer 28 and 77 may be Ti, Ni, Ag, Al or a combination thereof. A structure of the Schottky device 1 according to one embodiment of the invention is now ready.

To sum up, the present invention adopts a method chosen from the thermal drive-in, the vapor diffusion or the ion implantation process to form the PN-junction 75 between the lattice defect structure 23 and the epitaxial layer 21 within the active region 30. Based on the characteristics of the PN-junction 75, a Schottky barrier height lowered by the lattice defect structures 23 may be increased. Therefore, a voltage sustaining ability may be improved and current leakage can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a Schottky device, comprising:
   providing a substrate having a first conductivity type;
   forming an epitaxial layer on the substrate, wherein the epitaxial layer has the first conductivity type and at least a lattice defect structure located under a surface of the epitaxial layer;
   forming a silicide layer on the surface of the epitaxial layer;
   forming a modulated carrier concentration region of the first conductivity type in the surface of the epitaxial layer, wherein when forming the modulated carrier concentration region a doped region with a second conductivity type encompassing the lattice defect structure is formed, wherein a PN junction is between the doped region and the epitaxial layer or between the doped region and the modulated carrier concentration region; and
   forming a conductive layer on the silicide layer.

2. The fabricating method of the Schottky device according to claim 1, wherein a step of forming the doped region further comprises;
   forming a dopant source layer on the silicide layer, wherein the dopant source layer has a plurality of dopants of the second conductivity type; and
   performing a thermal drive-in process to diffuse the dopants from the dopant source layer into the epitaxial layer.

3. The fabricating method of the Schottky device according to claim 1, wherein a step of forming the doped region comprises a vapor phase diffusion or an ion implantation process.

4. The fabricating method of the Schottky device according to claim 1, further comprising:
   forming a buffer layer on the silicide layer before forming the dopant source layer.

5. The fabricating method of the Schottky device according to claim 4, further comprising:
   removing the dopant source layer and the buffer layer after performing the thermal drive-in process.

6. The fabricating method of the Schottky device according to claim 1, wherein a doping concentration of dopants of the second conductivity type in the doped region ranges from 1e14 atoms/cm3 to 1e19 atoms/cm3.

7. The fabricating method of the Schottky device according to claim 1, wherein the first conductivity type is N-type and the second conductivity type is P-type.

* * * * *